United States Patent
Yu et al.

(10) Patent No.: US 6,200,886 B1
(45) Date of Patent: Mar. 13, 2001

(54) FABRICATING PROCESS FOR POLYSILICON GATE

(75) Inventors: Hong-Chen Yu, Yi-Lan Hsien; Hsi-Mao Hsiao, Hsinchu; Hsi-Chin Lin, Hsinchu Hsien; Chun-Lung Chen, Tainan Hsein, all of (TW)

(73) Assignees: United Silicon Incorporated; United Microelectronics Corp., both of Hsinchu (TW)

(*) Notice: Subject to any disclaimer, the term of this patent is extended or adjusted under 35 U.S.C. 154(b) by 0 days.

(21) Appl. No.: 09/428,353

(22) Filed: Oct. 28, 1999

(51) Int. Cl.⁷ .................................................. H01L 21/4763
(52) U.S. Cl. ............................................ 438/585; 438/299
(58) Field of Search ...................................... 438/197, 299, 438/301, 585

(56) References Cited

U.S. PATENT DOCUMENTS 5,656,519 * 8/1997 Mogami .
5,920,095 * 7/1999 Davies et al. .......................... 257/353
5,956,584 * 9/1999 Wu ........................................ 438/232

* cited by examiner

Primary Examiner—Long Pham
(74) Attorney, Agent, or Firm—Charles C.H. Wu; Charles C.H. Wu & Associates, APC

(57) ABSTRACT

A fabrication process for a polysilicon gate is described in which a silicon dioxide layer of various thicknesses is formed on the substrate and on the polysilicon gate with an overlying anti-reflection layer. The silicon dioxide layer is removed with enough silicon dioxide layer remaining to cover the sidewalls of the polysilicon gate and the silicon substrate before the removal of the anti-reflection layer. The sidewalls of the polysilicon gate and the silicon substrate are thus simultaneously protected during the removal of the anti-reflection layer.

5 Claims, 3 Drawing Sheets

FABRICATING PROCESS FOR POLYSILICON GATE

BACKGROUND OF THE INVENTION

1. Field of the Invention

The present invention relates to a fabrication process for an integrated circuit. More particularly, the present invention relates to a fabrication process for a polysilicon gate.

2. Description of the Related Art

In general, a gate is formed with polysilicon or other similar types of material. During gate definition, however, polysilicon tends to reflect the light used for the photolithography process and leads to photolithography errors. In the fabrication process of a semiconductor device, an anti-reflection layer is typically formed on the polysilicon layer before defining the gate to avoid the reflection of the light by the polysilicon layer. The anti-reflection layer is usually formed with a silicon oxynitride material and is removed after the gate is defined. Methods to remove the antireflection layer include etching with a hot phosphoric acid solution. The polysilicon, however, is easily corroded by the hot phosphoric acid, resulting in an incomplete gate structure or even a peeling of the gate.

FIGS. 1A to 1D are schematic, cross-sectional views showing the manufacturing of a gate structure according to the conventional practice.

Referring to FIG. 1A, a substrate 100 is provided, followed by a formation of a layer 101 on the substrate 100. Since the polysilicon easily reflects the photolithography light and results in photolithography errors in the subsequent definition of the polysilicon gate, a silicon oxynitride anti-reflection layer 103 is normally formed on the polysilicon layer 101 to prevent the reflection of light by the polysilicon layer 101 before defining the polysilicon gate. A photoresist pattern 106 is thereafter formed on the anti-reflection layer 103.

As shown in FIG. 1B, with the photoresist pattern 106 serving as a mask, the anti-reflection layer 103 (as shown in FIG. 1A) and the polysilicon layer 101 (as shown in FIG. 1A) are etched to form a polysilicon gate 102 on the substrate 100. The anti-reflection layer after the etching is designated by reference number 104.

Referring to FIG. 1C, the photoresist pattern 106 (as shown in FIG. 1B) is removed, exposing the anti-reflection layer 104.

Referring to FIG. 1D, the anti-reflection layer 104 above the polysilicon gate 102 is removed by a hot phosphoric acid solution to complete the formation of the polysilicon gate. The etching rate of the hot phosphoric acid to polysilicon is, however, relatively high, and the sidewall of the polysilicon gate is thereby easily corroded by the hot phosphoric acid, leading to a peeling of the gate.

SUMMARY OF THE INVENTION

Based on the forgoing, the present invention provides a fabrication process for a polysilicon gate. A substrate is provided, and a polysilicon layer and an anti-reflection layer are sequentially formed on the substrate in which the anti-reflection layer is preferably a silicon oxynitride. The anti-reflection layer and the polysilicon layer are then patterned to form a polysilicon gate. After this, thermal oxidation is conducted to form a silicon dioxide layer on the surface of the silicon substrate, the sidewalls of the polysilicon gate and the surface of the anti-reflection layer. Using the anti-reflection layer as an etching stop, the silicon dioxide layer on the anti-reflection layer is etched back and removed, with only enough anti-reflection layer to cover the sidewalls of the polysilicon gate and the surface of the polysilicon substrate. The anti-reflection layer is further removed by the hot phosphoric acid.

The silicon dioxide layer generated in the present invention can provide protection to the sidewall of the polysilicon gate and the silicon substrate during the removal of the anti-reflection layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2F are schematic, cross-sectional views showing the fabrication process of a polysilicon gate according to the present invention.

Figure 1A:
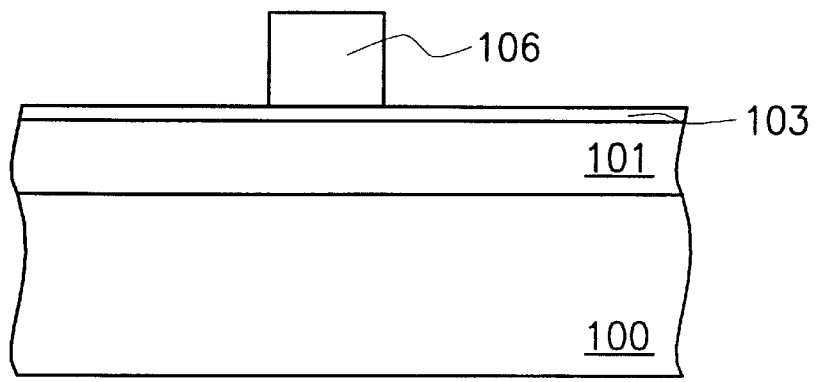
FIGS. 1A to 1D are schematic, cross-sectional views showing the fabrication process of a polysilicon gate according to the prior art.
Figure 1B:
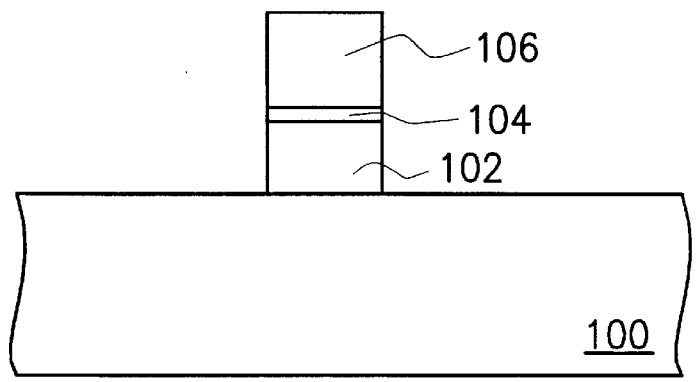
Figure 1C:
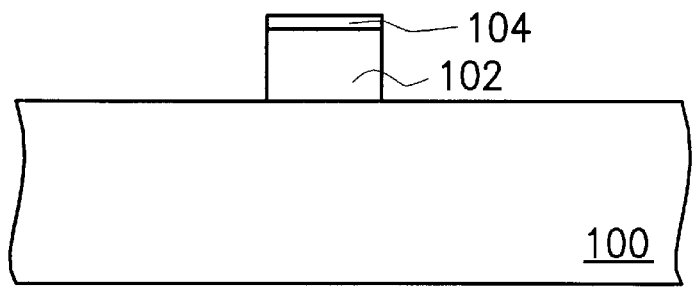
Figure 1D:
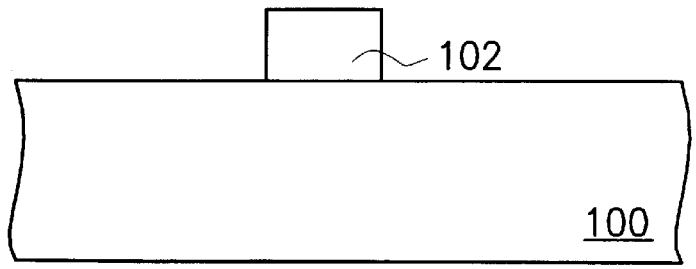
Figure 2A:
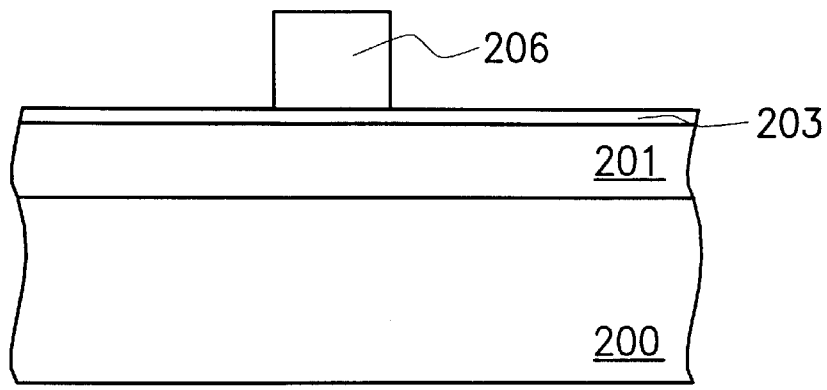
FIGS. 2A to 2F are schematic, cross-sectional views showing the fabrication process of a polysilicon gate according to the present invention.

Referring to FIG. 2A, a silicon substrate 200 is provided. A polysilicon layer 201 is then formed on the substrate 200. An anti-reflection layer 203, usually a layer of silicon oxynitride, is formed on the polysilicon layer 201 to prevent the reflection of light by the polysilicon layer 201. A photoresist pattern 206 is further formed on the anti-reflection layer 203.

Figure 2B:
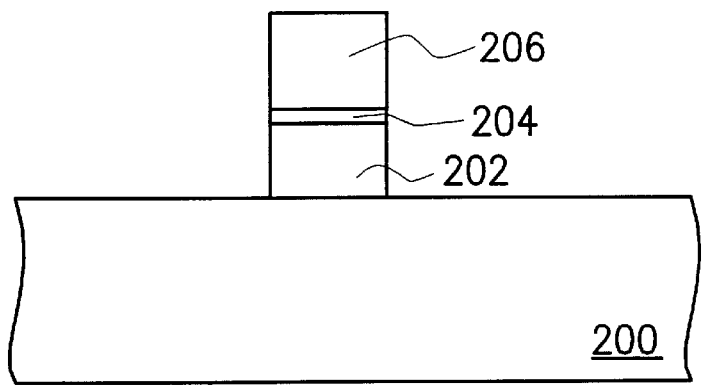

As shown in FIG. 2B, using the photoresist pattern as a mask, the antireflection layer 203 (FIG. 2A) and the polysilicon layer 201 (FIG. 2A) are etched to form a polysilicon gate 202 on the substrate 200. The post-etching anti-reflection layer is designated by reference number 204. The anti-reflection layer 204 also serves as a cap layer for the polysilicon gate 202.

Figure 2C:
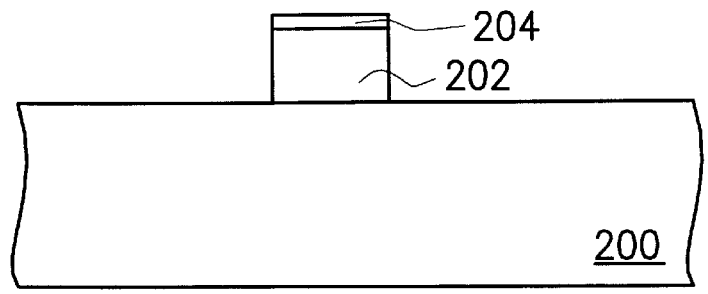

As shown in FIG. 2C, the photoresist pattern 206 (as shown in FIG. 2B) is removed, exposing the anti-reflection layer 204.

Figure 2D:
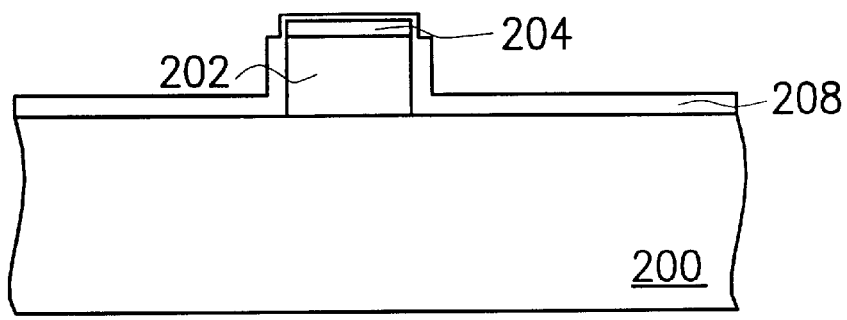

Referring to FIG. 2D, the step to generate silicon dioxide is conducted by means of thermal oxidation, for example, a rapid thermal oxidation (RTO) process. During the thermal oxidation process, a silicon dioxide layer 208 is generated on the surface of the anti-reflection layer 204, the sidewalls of the polysilicon gate 202 and the surface of the silicon substrate 200.

Of notable importance is the non-uniform thickness of the silicon dioxide layer 208. The thickness of the silicon dioxide layer 208 on the surface of the anti-reflection layer 204 is less than that on the sidewall of the polysilicon gate 202 and the surface of the substrate. The rate of silicon dioxide generation on the anti-reflection layer 204, such as silicon oxynitride, is slower than on the polysilicon gate 202 and the silicon substrate 200 under the same thermal oxidation conditions.

Figure 2E:
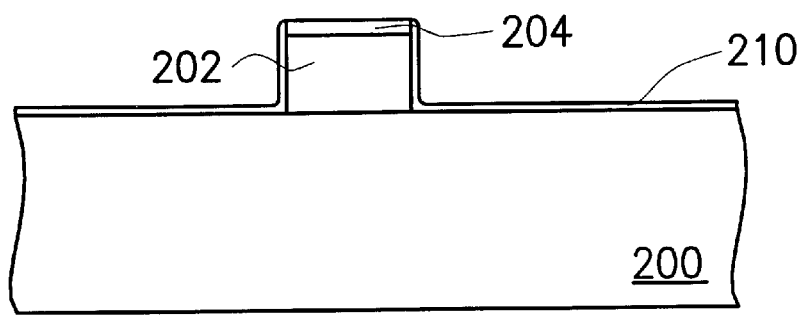

As shown in FIG. 2E, the silicon dioxide layer 208 (as shown in FIG. 2D) on the anti-reflection layer 204 is removed until the anti-reflection layer 204 is exposed. Methods to remove the silicon dioxide layer 208 include etching back using the antireflection layer 204 as an etch stop. The remaining thickness of the silicon dioxide layer 210 is enough to cover the sidewalls of the polysilicon gate 202 and the silicon substrate 200.

Figure 2F:
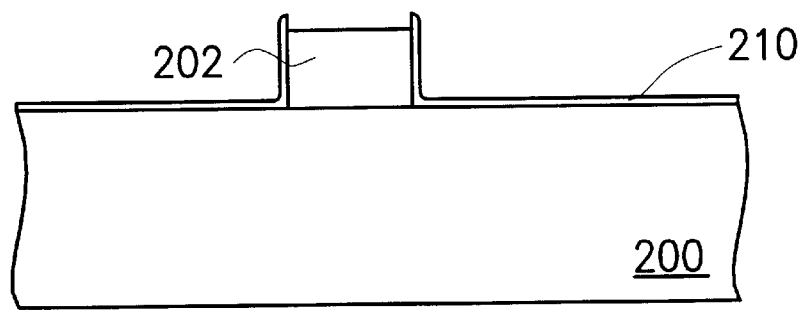

Referring to FIG. 2F, the anti-reflection layer 204 is removed by, for example, a hot phosphoric acid. The surface of the silicon substrate 200 and the sidewalls of the polysilicon gate 202 are protected by the overlying silicon dioxide layer 210 hence are prevented from being corroded by the hot phosphoric acid during the removal of the anti-reflection layer 204. In other words, the effect of the present invention is achieved if the silicon dioxide layer 210 on the sidewall of the polysilicon gate is thick enough to protect the polysilicon gate 202 until the anti-reflection layer 204 is completely removed. The problem of the peeling of the gate is thereby eliminated. Another important point to note is that besides reducing the peeling of the polysilicon, the silicon dioxide layer 210 also protects the silicon substrate 200 from being corroded. Therefore, the potential of the silicon dioxide layer 210 of the present invention goes beyond a gate sidewall spacer because the general spacer cannot simultaneously provide protection to the sidewall of the polysilicon gate 202 and the silicon substrate 200.

One of the reasons that the silicon dioxide layer in the present invention can protect the polysilicon gate and the silicon substrate during the removal of the anti-reflection layer by the hot phosphoric acid is because the etching rate of the hot phosphoric acid for the silicon dioxide layer is low.

The present invention provides the following benefits. The incidence of the peeling of the sidewalls of the polysilicon gate is reduced. Furthermore, the silicon dioxide layer simultaneously protects the sidewalls of the polysilicon gate and the silicon substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication process for a polysilicon gate, the process comprising the steps of:

providing a silicon substrate;

sequentially forming a polysilicon layer and an anti-reflection layer;

patterning the polysilicon layer and the anti-reflection layer to form a polysilicon gate;

conducting thermal oxidation to form a silicon dioxide layer on a surface of the silicon substrate, sidewalls of the polysilicon gate and a surface of the anti-reflection layer;

etching back the silicon dioxide layer with the anti-reflection layer serving as an etch stop to remove the silicon dioxide layer on the anti-reflection layer, leaving enough silicon dioxide layer to cover the sidewalls of the polysilicon gate and the surface of the silicon substrate; and removing the anti-reflection layer with a hot phosphoric acid.

2. The fabrication process for a polysilicon gate according to claim 1, wherein the anti-reflection layer is silicon oxynitride.

3. A fabrication process for a polysilicon gate, the process comprising the steps of:

providing a silicon substrate comprising a polysilicon gate and a silicon containing film layer covering the polysilicon gate, wherein a rate of silicon dioxide generation on the silicon containing film layer is lower than a rate of silicon dioxide generation on the silicon substrate and the polysilicon gate;

conducting thermal oxidation to form a silicon dioxide layer on a surface of the silicon substrate, sidewalls of the polysilicon gate and a surface of the silicon containing film layer;

etching back the silicon dioxide layer while using the silicon containing film layer to as an etch stop to remove the silicon dioxide layer on the film layer containing silicon, leaving enough silicon dioxide layer to cover the sidewalls of the polysilicon gate and the surface of the silicon substrate; and removing the silicon containing film layer.

4. The fabrication process for a polysilicon gate according to claim 3, wherein the film layer containing silicon includes a silicon oxynitride layer.

5. The fabrication process for a polysilicon gate according to claim 3, wherein the silicon containing film layer is removed by a hot phosphoric acid.

* * * * *